United States Patent
Chen et al.

(10) Patent No.: US 8,763,457 B2
(45) Date of Patent: Jul. 1, 2014

(54) SENSING DEVICE AND MANUFACTURING METHOD THEREOF

(75) Inventors: Lung-Tai Chen, Kaohsiung (TW); Yu-Wen Hsu, Tainan (TW); Tzong-Che Ho, Hsinchu (TW); Li-Chi Pan, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 236 days.

(21) Appl. No.: 13/154,426

(22) Filed: Jun. 6, 2011

(65) Prior Publication Data

US 2012/0260747 A1    Oct. 18, 2012

(30) Foreign Application Priority Data

Apr. 15, 2011   (TW) .............................. 100113226 A

(51) Int. Cl.
*G01D 11/24*   (2006.01)

(52) U.S. Cl.
USPC .......................................................... 73/431

(58) Field of Classification Search
None
See application file for complete search history.

(56) References Cited

U.S. PATENT DOCUMENTS

| | | | |
|---|---|---|---|
| 6,042,264 A * | 3/2000 | Prusik et al. ................ | 374/106 |
| 6,470,594 B1 | 10/2002 | Boroson et al. | |
| 6,635,509 B1 | 10/2003 | Ouellet | |
| 6,840,103 B2 * | 1/2005 | Lee et al. ................... | 73/335.05 |
| 7,159,459 B2 | 1/2007 | Gogoi | |
| 2002/0023500 A1 * | 2/2002 | Chikuan et al. ................ | 73/715 |
| 2002/0036546 A1 * | 3/2002 | Hatanaka et al. ............... | 331/68 |
| 2003/0056598 A1 * | 3/2003 | Kimura et al. .................. | 73/754 |
| 2011/0203378 A1 * | 8/2011 | Buccafusca et al. ............ | 73/655 |

OTHER PUBLICATIONS

P. Kerz, K. Reimer, et al., "Combined MEMS inertial sensors for IMU applications", 2010 IEEE 23rd International Conference on Micro Electro Mechanical Systems (MEMS), Dec. 10, 2009, p. 488-491.

Kuan-Lin Chen et al., "An Integrated Solution for Wafer-Level Packaging and Electrostatic Actuation of Out-of-Plane Devices", IEEE 22nd International Conference on Micro Electro Mechanical Systems, Jan. 29, 2000, p. 1071-1074.

Mathieu Hautefeuille et al., "Miniaturised multi-MEMS sensor development", Microelectronics Reliability, Mar. 29, 2009, p. 621-626.

* cited by examiner

*Primary Examiner* — Robert R Raevis
(74) *Attorney, Agent, or Firm* — Jianq Chyun IP Office

(57) ABSTRACT

A sensing device can be provided with sealed and open-type chambers in various conditions for accommodating different types of sensing structural components by stacking multiple substrates, wherein the condition of a sealed chamber depends on condition taken in substrate bonding process. Owing to sealing a channel of the sealed chamber by the substrate, superior sealing performance is achieved as compared to those adopting solder or sealing material, and thus the condition of the sealed chamber can be finely controlled.

19 Claims, 12 Drawing Sheets

SENSING DEVICE AND MANUFACTURING METHOD THEREOF

CROSS-REFERENCE TO RELATED APPLICATION

This application claims the priority benefit of Taiwan application serial no. 100113226, filed Apr. 15, 2011. The entirety of the above-mentioned patent application is hereby incorporated by reference herein and made a part of this specification.

BACKGROUND

1. Technical Field

The disclosure relates to a sensing device and manufacturing method thereof. In particular, the disclosure relates to a sensing device and manufacturing method thereof having chambers formed by multiple stacking substrates.

2. Related Art

In general, the sensing element in a micro-electromechanical sensing device should operate in a sensing chamber of specific environmental condition in order to obtain a stable operation and a precise output result. The environmental condition within the sensing chamber accommodating the sensing element varies based on the requirements of different sensing devices. For example, the effect of the vibration damper of sensing device to the ratio of the vibration frequency to sensing noise signal has to be considered in some sensing devices. Thus, the sensing element is disposed in a high sub-atmospheric environment or of vacuum airtight chamber in order to reduce the energy consumption due to the air damping. In addition, some sensing elements need the assistance of a proper air damping of vibration so as to properly, stably and instantaneously output signal. Thus, those sensing elements are preferably disposed in a chamber of specific pressure (such as an atmospheric pressure) for operating. Besides, some sensing elements has to be disposed in a sensing chamber having a gas with specific mixed composition or a gas with specific single composition for operating to achieve the improvement or compensation of the specific sensing characteristic.

In the airtight chamber mentioned above, the environmental condition within the sensing chamber will not react with the outside environment such as air intake or outlet. However, except the airtight chamber, there are some open-type chambers capable of connecting with the outside environment, wherein sensing elements, such as pressure gauges, gas sensors or the like, within the chamber can react with the outside environment in order to detect specific physical quantities of the outside environment.

However, although the aforementioned different types of sensing elements can be respectively and independently packaged by their own packaging processes in chambers of different environmental conditions to form sensing devices, the integrating of the different types of sensing elements is however restricted by the requirement of different environmental conditions of chamber. When more than two sensing elements having different environmental conditions requirement have to be integrated to the same semiconductor substrate, how to form a plurality of sensing chambers having different environmental conditions independently on the same semiconductor substrate is the existing difficult technical problem.

On the other hand, in conventional, methods of re-soldering solder or deposition filling material or the like are common used to fill the channel of the chamber in order to form an airtight chamber. However, those methods may lead to the filling material being deposited on the sensing element or polluting the interior of chamber and the sensing element failing to operate. Furthermore, since these sorts of solders or sealing materials are rather loose in structure, the sealed chamber is unable to achieve a good tightness and the environmental condition within the sealed chamber also can not be ensured.

SUMMARY

The sensing device provided in a first embodiment of the disclosure includes a first substrate, a second substrate and a plurality of sensing elements. The first substrate has a carrying surface. The second substrate has a first surface and a second surface opposite to the first surface. The second substrate is attached to the carrying surface of the first substrate to have a plurality of chambers independent to each other between the second substrate and the first substrate. The second substrate seals the first chamber of the chambers mentioned above. And the second substrate has at least one first channel connecting to one of the remaining chambers to the second surface. The sensing elements are respectively disposed within the chambers.

In addition, the sensing elements are formed on the carrying surface of the first substrate in the manufacturing method provided in the disclosure. Then, the second substrate is attached to the carrying surface to form the plurality of chambers between the second substrate and the first substrate. Herein, the environmental condition within the sealed first chamber is determined by the process environment when the second substrate is attached to the first substrate.

One or a plurality of fourth substrates and a second cover plate can further be selectively stacked to the second surface of the second substrate in the disclosure, in order to seal the corresponding chamber so that the plurality of chambers have different environmental conditions, for example, different chamber pressure, different gas compositions or different forms of chambers (such as open-type chamber or airtight chamber). Different types of sensing elements can be integrated to the same semiconductor substrate through the plurality of chambers having different environmental conditions, so as to meet the requirements of environmental condition within chamber where sensing elements locate.

The sensing device provided in a second embodiment of the disclosure includes a first substrate, a second substrate and a plurality of sensing elements. The first substrate has a carrying surface. The second substrate has a first surface and a second surface opposite to the first surface. The second substrate is attached to the carrying surface of the first substrate through the first surface. And a chamber is between the second substrate and the first substrate, and the sensing element is disposed within the chamber. The second substrate has a channel connecting the chamber to the second surface. The second cover plate is attached to the second surface of the second substrate, and the second cover plate covers the channel to seal the chamber.

In addition, a second substrate is foamed on the carrying surface of the first substrate in the provided manufacturing method of the disclosure, wherein a sensing element having a chamber and located therein is formed between the second substrate and the first substrate. The second substrate has a channel connecting the chamber to the second surface. Then, a second cover plate is attached to the second substrate to cover the channel and seals the chamber.

In order to make the aforementioned and other features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
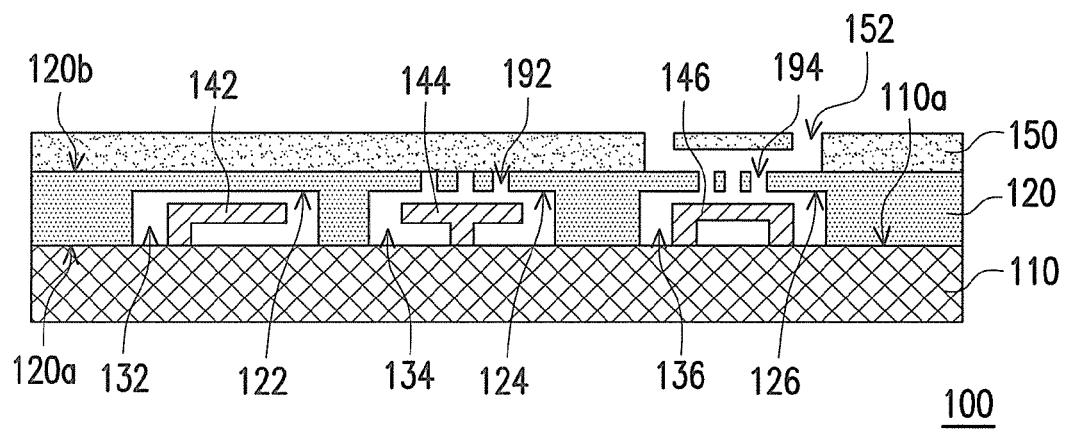
FIG. 1A to 1B illustrates a sensing device according to the first and second embodiment of the disclosure.

The first to be explained is that numbers of the similar or same components may be the same in each embodiment of the disclosure.

The disclosure provides a sensing device and method, integrating chambers with different environmental conditions to a same first substrate (such as a chip), in order to accommodate different types of sensing elements. Thus, under different chamber environmental conditions, different chamber pressure, different gas compositions and different forms of chambers are included. The structure is simple and easy to manufacture. The extra filling process is unnecessary. Process yield can be improved and manufacturing cost can be reduced.

In additional, the disclosure provides another sensing device, the channels of chambers are sealed by using substrates. Thus, comparing to the solder or sealing materials with loose structure, a good tightness is provided and it facilitates the control of the environmental condition within the chamber.

The disclosure further provides a sensing device, capable to provide a sealed chamber with good tightness and reliability.

The disclosure provides another manufacturing method of sensing device, in which the channels of chamber are sealed by using substrates. Thus, comparing to the solder or sealing materials with loose structure, a good tightness is provided and it facilitates the control of the environmental condition within the chamber.

FIG. 1 illustrates a sensing device 100 according to the first embodiment of the disclosure. As shown in FIG. 1, the sensing device 100 includes a first substrate 110, a second substrate 120 and a second cover plate 150. The second substrate 120 is disposed on the first substrate 110 and the second cover plate 150 is disposed on the second substrate 120.

In one embodiment of the disclosure, the first substrate 110 can be a semiconductor substrate. The second substrate 120 has a plurality of chambers 132, 134, 136. The shapes of chambers 132, 134, 136 can be geometric shapes. In other words, the first substrate 110 and the second substrate 120 are mutually formed into three independent chambers including a first chamber 132, a second chamber 134 and a third chamber 136, wherein the second substrate 120 has a first surface 120*a* and a second surface 120*b* opposite to the first surface 120*a*. And the second substrate 120 is attached to the carrying surface 110*a* of the first substrate 110 through the first surface 120*a*. The first substrate 110 and the first surface 120*a* of the second substrate 120 has a first concaved portion 122, a second concaved portion 124 and a third concaved portion 126 to form the first chamber 132, the second chamber 134 and the third chamber 136. The first substrate 110 and the second substrate 120 seal the first chamber 132, and the second substrate 120 has a first channel 192 and a second channel 194 respectively connecting the second chamber 134 and the third chamber 136 to the outside of the second surface 120*b*. According to the embodiment structure of the sensing device 100 of the disclosure, the first channel 192 and the second channel 194 mentioned here can include one or more through holes. A first sensing element 142, a second sensing element 144 and a third sensing element 146 are respectively disposed within the first chamber 132, the second chamber 134 and the third chamber 136.

In addition, the sensing device 100 of the first embodiment further includes a second cover plate 150, disposed on the second surface 120*b* of the second substrate 120, for example, and the second cover plate 150 covers the first channel 192 which is connected with the second chamber 134 so as to seal the second chamber 134. Moreover, the second cover plate 150 has a third channel 152 passing through the second cover plate 150 and is connected to the second channel 194 and the third chamber 136. According to the embodiment structure of the sensing device 100 of the disclosure the third channel 152 mentioned here can include one or more through holes. In other words, in the first embodiment, the first chamber 132 is formed through the second substrate 120, the sealed second chamber 134 is formed through the second cover plate 150, and the second cover plate 150 has a third channel 152 to connect the third chamber 136 to outside. Accordingly, the first embodiment can provide a first chamber 132, a second chamber 134 and a third chamber 136 with three different environmental conditions to accommodate different types of first sensing element 142, second sensing element 144 and third sensing element 146. The environmental condition within the first chamber 132 can be determined by the process environment when the second substrate 120 is bonded to the first substrate 110. The environmental condition within the second chamber 134 can be determined by the process environment when the second cover plate 150 is bonded to the second substrate 120. The environmental condition within the third chamber 136 is that of the environmental where the sensing device 100 located.

As in the first embodiment, the first sensing element 142, the second sensing element 144 and the third sensing element 146 are, for example, the sensing elements fabricated by micro-electromechanical process. According to the design in ordinary view of the related art, the sensing element includes two parts comprising a movable element and a fixed element, and the movable element is commonly disposed on the fixed element. The movable element and the fixed element are familiar to those skilled in the art and thus not shown in figures, and are not limited to the scope disclosed in the embodiment. The overall relevant similar sensing elements are included in the spirit and scope of the disclosure. For example, in the first embodiment, the fixed element is disposed on the first substrate 110, so that the movable element disposed on the fixed element can hang or suspend upon the carrying surface 110a of the first substrate 110. The first chamber 132 or the second chamber 134 is a sealed chamber. Thus, the chamber pressure of the first chamber 132 or the second chamber 134 can be controlled under a specific pressure. And the gas composition of the first chamber 132 or the second chamber 134 may be the common atmosphere, a specific single gas or a gas mixed with two or more specific compositions. At this moment, the first sensing element 142 or the second sensing element 144 which is adapted to be disposed within the first chamber 132 or the second chamber 134, for example, is an accelerometer or a radio frequency switch or other possible element. In addition, the first chamber 132 or the second chamber 134 may also be a vacuum environment, i.e., the chamber pressure of the first chamber 132 or the second chamber 134 is substantially a vacuum pressure. At this moment, the first sensing element 142 or the second sensing element 144 which is adapted to be disposed within the first chamber 132 or the second chamber 134, for example, is a quartz crystal, an oscillator, a reference pressure gauge, a radio frequency switch or gyroscope or other possible element. In addition, the third chamber 136 is connected to outside environment through the third channel 152, thus the chamber pressure of the third chamber 136 is the environmental pressure. The third sensing element 146 adapted to be disposed within the third chamber 136, for example, is a pressure gauge, a hydrometer, a gas sensor, an image sensor or a photo sensor or other possible element.

Figure 1B:
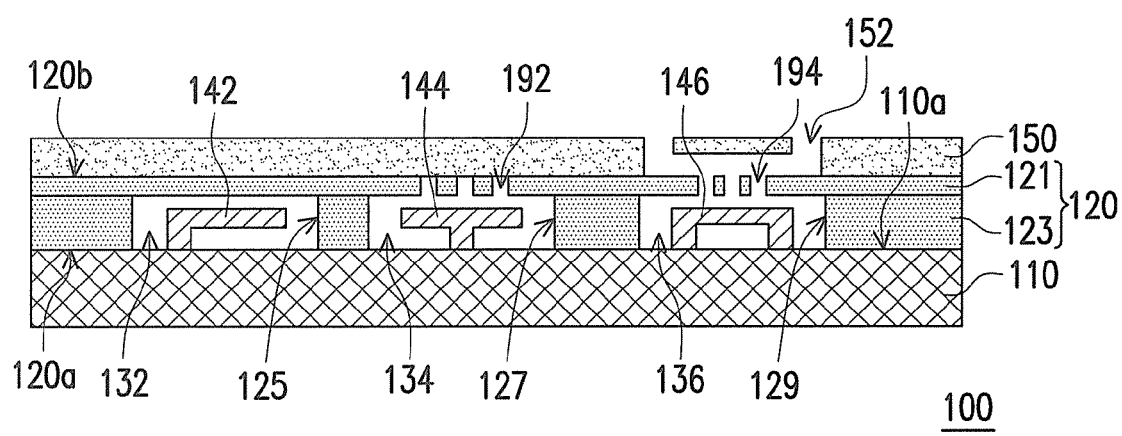

As shown in FIG. 1B, in the second embodiment of the disclosure, the first substrate 110 can be a semiconductor substrate. The second substrate 120 includes a first cover plate 121 and a third substrate 123. The third substrate 123 has a plurality of through holes 125, 127, 129. The shapes of the through holes 125, 127, 129 can be geometric shapes. The disclosure further includes a first cover plate 121 and a third substrate 123 disposed on the second substrate 120. For example, the third substrate 123 is disposed on the first substrate 110, and the first cover plate 121 is disposed on the third substrate 123. Thus, three chambers including a first chamber 132, a second chamber 134 and a third chamber 136 are formed. Herein, the second substrate 120 has a first surface 120a and a second surface 120b opposite to the first surface 120a. And the second substrate 120 is attached to the carrying surface 110a of the first substrate 110 through the first surface 120a. That means, the first surface 120a of the second substrate 120 is the first surface of the third substrate 123. The second surface 120b of the second substrate 120 is the second surface of the first cover plate 121. Hence, in the second embodiment, the first chamber 132 is formed by stacking the first substrate 110, the third substrate 123 and the first cover plate 121. Thus, the through holes 125, 127, 129 of the third substrate 123 and the first cover plate 121 are stacked to form the first chamber 132, the second chamber 134 and the third chamber 136. The first channel 192 and the second channel 194 are disposed at the location of the first cover plate 121 opposite to the second chamber 134 and the third chamber 136, and are respectively connected to the second chamber 134 and the third chamber 136. According to the embodiment structure of the sensing device 100 of the disclosure the first channel 192 and the second channel 194 mentioned here can include one or more through holes. A first sensing element 142, a second sensing element 144 and a third sensing element 146 are respectively disposed within the first chamber 132, the second chamber 134 and the third chamber 136, and disposed on the first substrate 110.

In addition, the sensing device 100 of the second embodiment of the disclosure further includes a second cover plate 150, disposed on the first cover plate 121, for example, and the second cover plate 150 covers the first channel 192 which is connected with the second chamber 134 so as to seal the second chamber 134. Moreover, the second cover plate 150 has a third channel 152 passing through the second cover plate 150 so that the third channel 152 is connected to the second channel 194 and the third chamber 136. According to the embodiment structure of the sensing device 100 of the disclosure the third channel 152 mentioned here can include one or more through holes. In other words, in the second embodiment, the first chamber 132 is formed through the first substrate 110, the third substrate 123 and the first cover plate 121 stacking together, and the sealed second chamber 134 is formed through the first substrate 110, the third substrate 123, the first cover plate 121 and the second cover plate 150, and the second cover plate 150 has a third channel 152 used to connect the third chamber 136 to outside. Accordingly, the second embodiment can provide a first chamber 132, a second chamber 134 and a third chamber 136 under three different environmental conditions to accommodate different types of first sensing element 142, second sensing element 144 and third sensing element 146. The environmental condition within the first chamber 132 can be determined by the process environment when the second substrate 120 is attached to the first substrate 110. The environmental condition within the second chamber 134 can be determined by the process environment when the second cover plate 150 is attached to the second substrate 120. The environmental condition within the third chamber 136 is the environmental condition where the sensing device 100 located.

Thus, the difference between the first and second embodiment is: the first substrate 120 of the first embodiment integrally forms the first chamber 132, the second chamber 134 and the third chamber 136; and in the second embodiment, the second substrate 120 of the first embodiment is formed by using the stacking of the third substrate 123 to the first cover plate 121. Hence, in the second embodiment, the first, second and third chamber 132, 134, 136 are formed by stacking the first substrate 110, the third substrate 123, the first cover plate 121 and the second cover plate 150.

The material of the first substrate 110, the second substrate 120, the third substrate 123, the first cover plate 121 and the second cover plate 150 of each above mentioned embodiment is semiconductor material, for example. Taking the first embodiment as an example, the first substrate 110, the second substrate 120 and the second cover plate 150 are three independent chips respectively, for example. Thus, it is needed to stack the second substrate 120 and the second cover plate 150 to the first substrate 110, then the corresponding first chamber 132 and second chamber 134 can be sealed. In the first embodiment, the second cover plate 150 can cover the first channel 192 to seal the second chamber 134, and no extra sealing material or solder is to fill the first channel 192. That is, the first channel 192 is filled with no material, and thus the normal operation of the second sensing element being affected by the relevant elements within the second chamber 134 or the internal wall of the through hole polluted due to the sealing material can be avoided. In addition, since the structure of the second cover plate 150 used for sealing the second chamber 134 in the first embodiment is much solider than solder or sealing material, comparing to the solder or sealing material with loose structure, a good tightness can be provided. Thus, it facilitates the control of the environmental condition within the second chamber 134. And the second embodiment also has the above mentioned efficiency and function.

In the following, the manufacturing method of the sensing device 100 is further described. FIG. 2A to 2E sequentially illustrates the steps of manufacturing a sensing device 100 according to the first embodiment of the disclosure. In addition, in order to clearly describe the technical features of sealing the first chamber 132 and the second chamber 134 by using the second substrate 120 and the second cover plate 150, FIG. 3A to 3C respectively illustrates the top view of the structure of FIG. 2A, FIG. 2C and FIG. 2E.

Figure 2A:
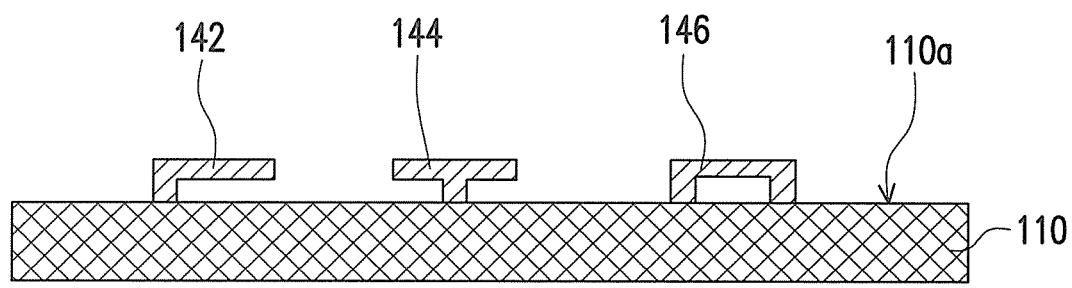
FIG. 2A to 2E sequentially illustrates the steps of manufacturing a sensing device according to the first embodiment of the disclosure.
Figure 2B:
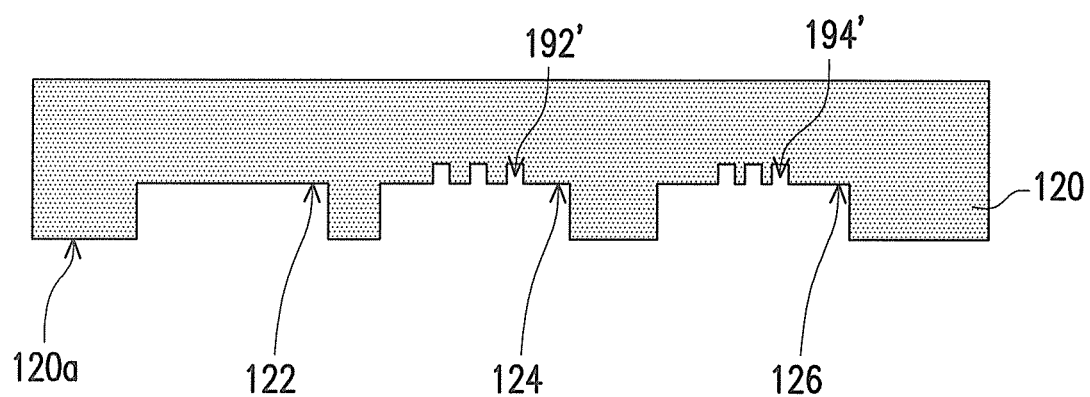
Figure 2C:
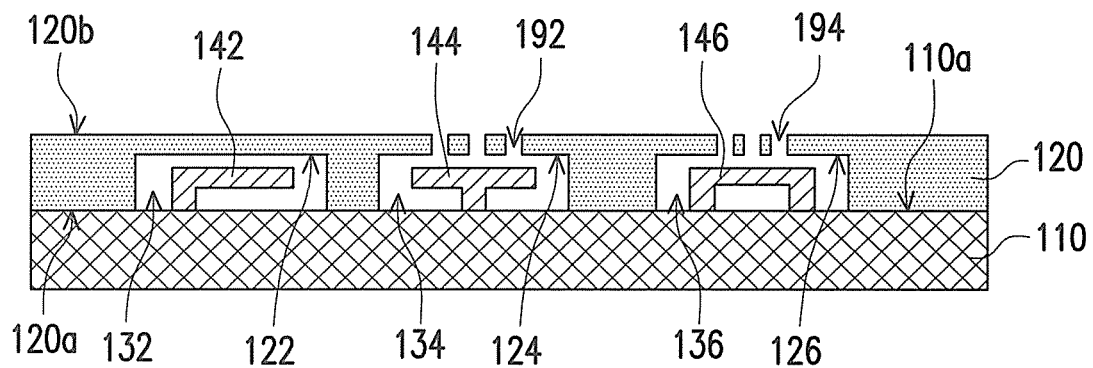
Figure 3A:
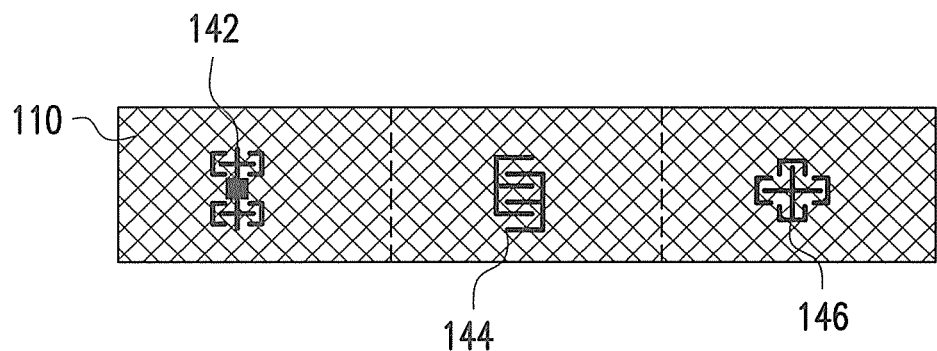
FIG. 3A to 3C respectively illustrates the top view of the structure of FIG. 2A, FIG. 2C and FIG. 2E.
Figure 3B:
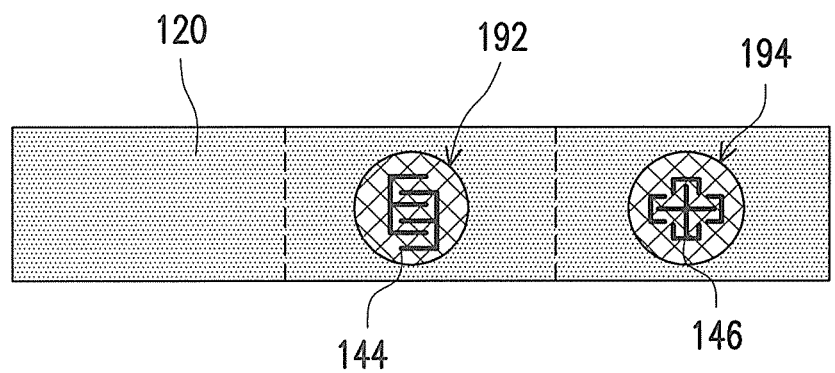
Figure 3C:
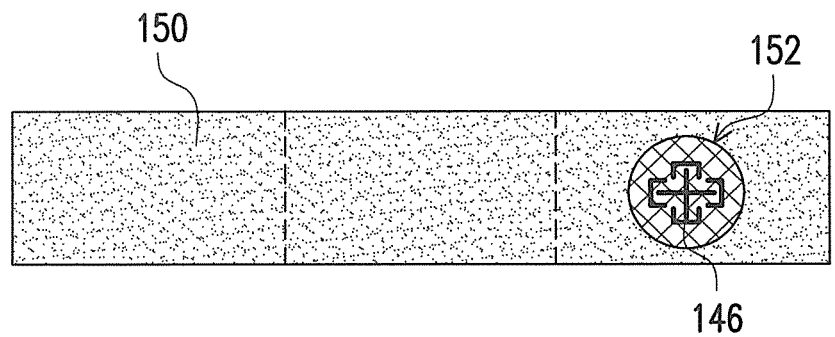

First, as shown in FIG. 2A and FIG. 3A, the first substrate 110 is provided, and the first sensing element 142, the second sensing element 144 and the third sensing element 146 are fabricated on the carrying surface 110a of the first substrate 110. Then, the second substrate 120' is provided as shown in FIG. 2B, and the first concaved portion 122, the second concaved portion 124 and the third concaved portion 126, the first channel pre-keep hole 192' and the second channel pre-keep hole 194' are fabricated on the first surface 120a of the second substrate 120' by etching process, for example. And then, as shown in FIG. 2C and FIG. 3B, the second substrate 120' is attached to the carrying surface 110a of the first substrate 110 so as to form the first chamber 132, the second chamber 134 and the third chamber 136 between the second substrate 120' and the first substrate 110. In the step illustrated in FIG. 2C, the second substrate 120 is formed by constructing the thinning process to the back surface of the second substrate 120', and the first channel 192 and the second channel 194 are open. The thinning process mentioned hereby includes removing portions of material of the second substrate 120' by the techniques like grinding, etching or laser burning. The first channel 192 and the second channel 194 are respectively connected to the second chamber 134 and the third chamber 136, and the first chamber 132 is sealed between the first substrate 110 and the second substrate 120. At this moment, the environmental condition within the first chamber 132 is equivalent with the process condition when the second substrate 120' is attached to the first substrate 110. Moreover, as shown in the top view of FIG. 3B, the first channel 192 and the second channel 194 respectively expose the second sensing element 144 within the second chamber 144 and the third sensing element 146 within the third chamber 136.

Figure 2D:
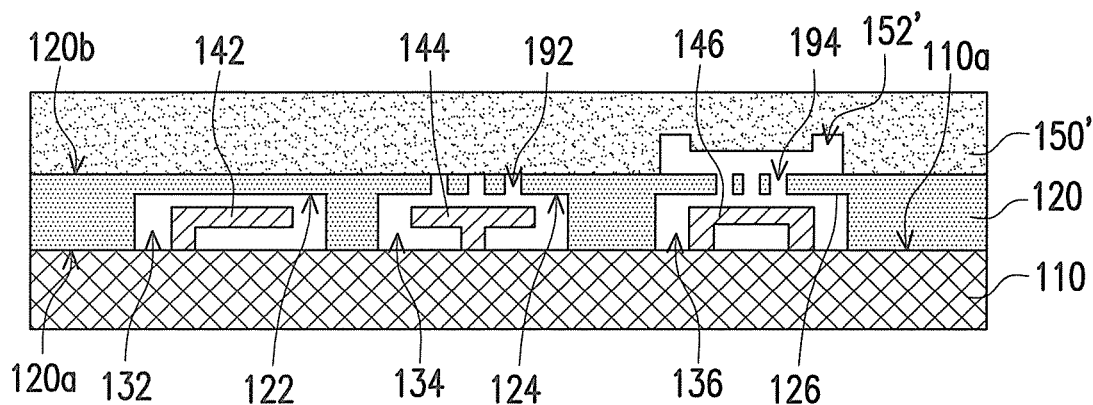
Figure 2E:
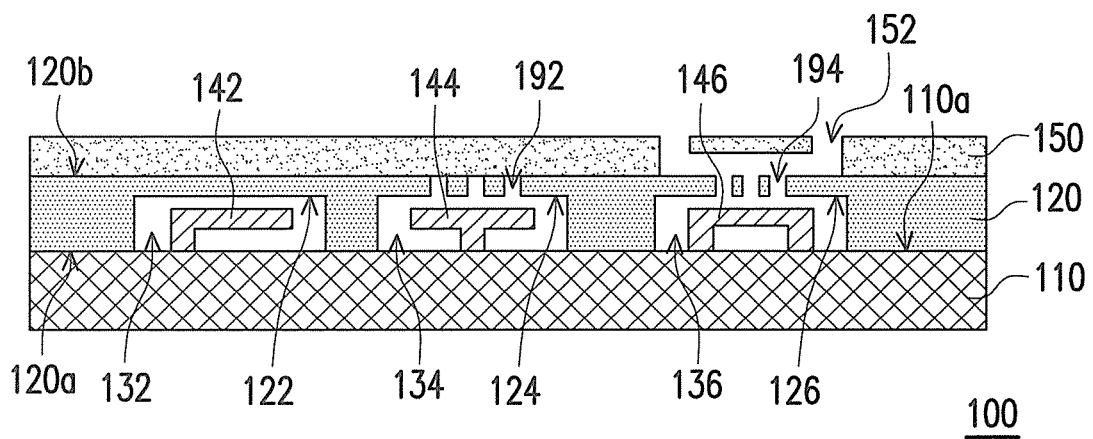

Then, as shown in FIG. 2D, the second cover plate 150' is attached to the second surface 120b of the second substrate 120. The third channel pre-keep hole 152' has been formed earlier on a side of the second cover plate 150', and the side having the third channel pre-keep hole 152' is attached to the second surface 120b of the second substrate 120. And then, as shown in FIG. 2E, the above mentioned thinning process is done to the back surface of the second cover plate 150' so as to form the second cover plate 150 and expose the third channel 152. At this moment, as shown in the top view of FIG. 3C, the first channel 192 of the second substrate 120 is covered by the second cover plate 150 so that the second sensing element 144 is sealed within the second chamber 134. At this moment, the environmental condition within the second chamber 134 is equivalent with the process condition when the second cover plate 150' is attached to the second substrate 120. Furthermore, since the first chamber 132 has been sealed earlier, the internal environmental condition is not affected by this process condition. In addition, the second channel 194 and the third channel 152 of the second cover plate 150 are connected together so that the second cover plate 150 exposes the sensing element within the third chamber 136.

At this point, the fabrication of the sensing device 100 is completed.

In the above mentioned step of FIG. 2C and FIG. 3B, if it is used for manufacturing the sensing device 100 of the second embodiment, first the third substrate 123 having through holes 125, 127, 129 is stacked to the carrying surface 110a of the first substrate 110, then the first cover plate 121 is stacked to the third substrate 123 so as to form the first chamber 132, the second chamber 134 and the third chamber 136. The first cover plate 121 has the first channel pre-keep hole 192' and the second channel pre-keep hole 194' thereon. The thinning process can be done on the back surface of the first cover plate 121 to open the first channel 192 and the second channel 194. The first channel 192 and the second channel 194 are respectively connected to the second chamber 134 and the third chamber 136, and the first chamber 132 is sealed between the first substrate 110 and the second substrate 120.

The sensing device of the second embodiment is completed by sequentially proceeding other steps illustrated after FIG. 2D.

Figure 4:
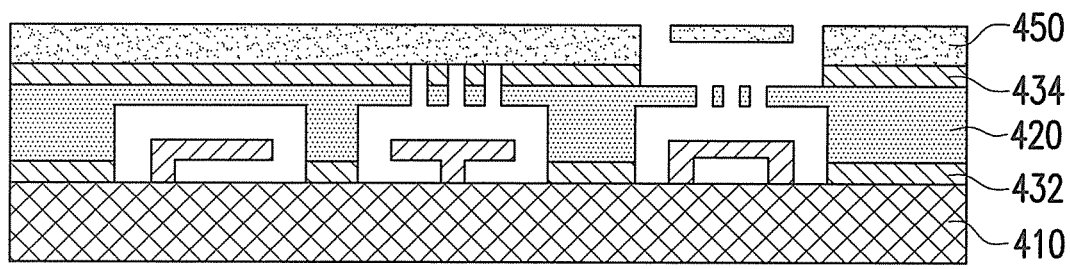
FIG. 4 illustrates the sensing device of FIG. 1 according to the third embodiment of the disclosure.

In the above mentioned first embodiment, chip bonding technique can be used for attaching the second substrate 120 to the first substrate 110 and attaching the second cover plate 150 to the second substrate 120. The chip bonding technique includes direct bonding technique such as cathode bonding, diffusion bonding, or plasma enhanced bonding or the like, or indirect bonding technique using intermediate bonding layer. In other words, as shown in FIG. 1A, it can be a direct contact between the first substrate 110 and the second substrate 120, and between the second substrate 120 and the second cover plate 150. Or as shown in FIG. 4 of the third embodiment, an intermediate bonding layer 432 can exist between the first substrate 410 and the second substrate 420 of the sensing device 100, and another intermediate bonding layer 434 can also exist between the second substrate 420 and the second cover plate 450. The material of the intermediate bonding layer 432 and 434 can be conductor, nonconductor or organic polymer.

Figure 5:
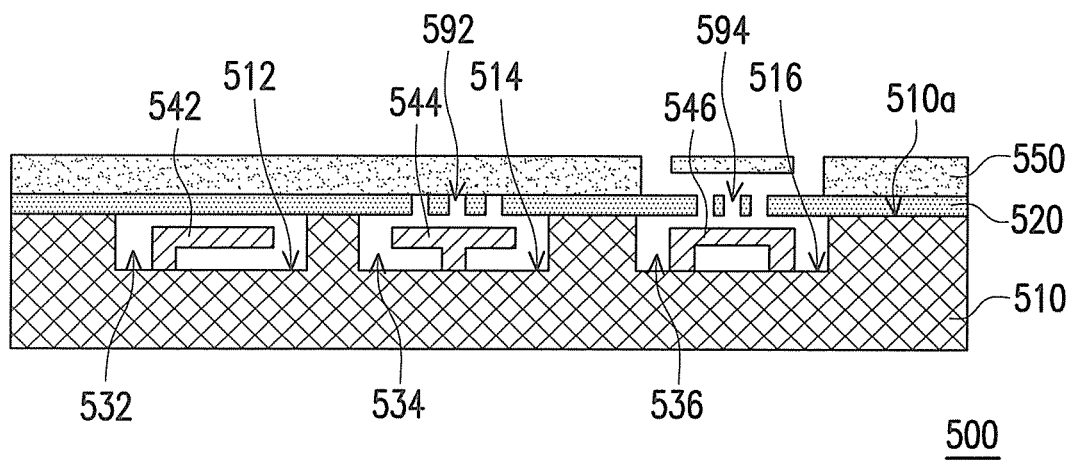
FIG. 5 illustrates the sensing device of FIG. 1 according to the fourth embodiment of the disclosure.

The sensing device 500 of FIG. 5 is the sensing device 100 of the fourth embodiment illustrated in FIG. 1. The sensing device 500 of FIG. 5 is similar to the sensing device 100 of FIG. 1, wherein the sensing element 542, 544 and 546 of the sensing device 500 is embedded within the substrate 510. In other words, the sensing element 542, 544 and 546 can be integrated to the first substrate 510 by using CMOS process or build-up stacking process, so that the height of the sensing element 542, 544 and 546 is lower than the carrying surface 510a of the first substrate 510. At this moment, the concaved portions 512, 514 and 516 are located on the carrying surface 510a of the first substrate 510, and together with the second substrate 520 are formed into three independent chambers 532, 534 and 536. The chambers 534 and 536 are respectively connected to the first channel 592 and the second channel 594 disposed on the second substrate 520. And the second cover plate 550 is disposed on the second substrate 520.

Figure 6:
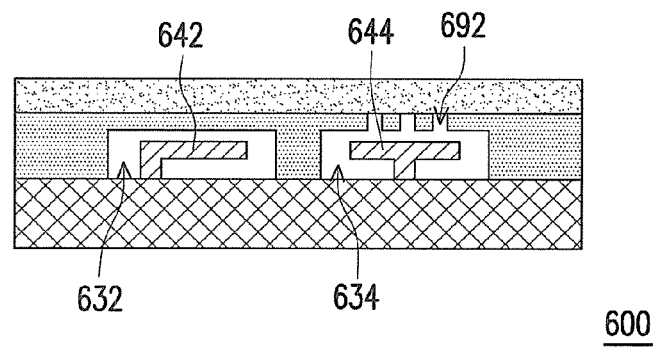
FIG. 6 illustrates a sensing device according to the fifth embodiment of the disclosure.

FIG. 6 illustrates a sensing device 600 according to the fifth embodiment of the disclosure. The sensing device 600 of FIG. 6 is similar to the sensing device 100 of FIG. 1 in structure and method of fabricating, wherein comparing the sensing device 600 to the sensing device 100, the open-type third chamber 136 and the third sensing element 146 within the third chamber 136 are omitted. In other words, the sensing device 600 has two closed-type chambers including the first chamber 632 and the second chamber 634. The first sensing element 642 and the second sensing element 644 are respectively disposed within the first chamber 632 and the second chamber 634. The second cover plate 650 covers the first channel 692 of the second substrate 620, and the environmental condition within the first chamber 632 and the second chamber 634 can be that described in above mentioned embodiment.

In the fifth embodiment, the second substrate can be formed by stacking the third substrate and the first cover plate, as shown in the structure of FIG. 1B of the second embodiment.

Figure 7:
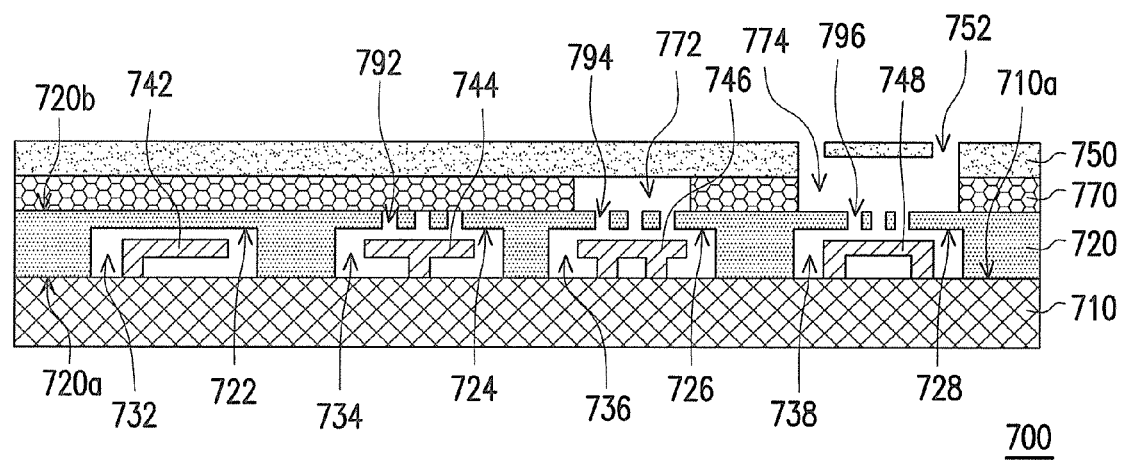
FIG. 7 illustrates a sensing device according to the sixth embodiment of the disclosure.

FIG. 7 illustrates a sensing device 700 according to the sixth embodiment of the disclosure. In the comparison of sensing device 700 of the sixth embodiment to the sensing device 100, an open-type chamber is added, and a fourth substrate 770 is inserted between the second cover plate 750 and the second substrate 720 so as to form four chambers 732, 734, 736, 738 having different environmental conditions. As shown in FIG. 7, the first substrate 710 and the second substrate 720 are mutually formed into four independent first chamber 732, second chamber 734, third chamber 736 and fourth chamber 738, wherein the second substrate 720 has a first surface 720a and a second surface 720b opposite to the first surface 720a. And the second substrate 720 is attached to the carrying surface 710a of the first substrate 710 through the first surface 720a.

In the sixth embodiment, the first surface 720a of the second substrate 720 has concaved portions 722, 724, 726, 728 used to form the chambers 732, 734, 736, 738. The second substrate 720 seals the first chamber 732, and the second substrate 720 has a first channel 792, a second channel 794 and a third channel 796 respectively connecting the second chamber 734, the third chamber 736 and the fourth chamber 738 to the second surface 720b. According to the embodiment structure of the sensing device 700 of the disclosure the first channel 792, the second channel 794 and the third channel 796 mentioned here can include one or more through holes. The first sensing element 742, the second sensing element 744, the third sensing element 746 and the fourth sensing element 748 are respectively disposed within the first chamber 732, the second chamber 734, the third chamber 736 and the fourth chamber 738.

In addition, the fourth substrate 770 is disposed on the second surface 720b of the second substrate 720, and the fourth substrate 770 covers the first channel 792 which is connected with the second chamber 734 so as to seal the second chamber 734. Moreover, the fourth substrate 770 has a fourth channel 772 and a fifth channel 774 respectively passing through the fourth substrate 770 and are connected to the second channel 794 and the third channel 796, so that the third chamber 736 and the fourth chamber 738 can respectively connect to the fourth channel 772 and the fifth channel 774 through the second channel 794 and the third channel 796. According to the embodiment structure of the sensing device 700 of the disclosure the fourth channel 772 and the fifth channel 774 mentioned here can include one or more through holes.

In addition, the second cover plate 750 is disposed on the fourth surface 770, and the second cover plate 750 covers the fourth channel 772 which is connected with the third chamber 736 so as to seal the third chamber 736. The second cover plate 750 has a sixth channel 752 passing through the second cover plate 750 and is connected to the fifth channel 774, the third channel 796 and the fourth chamber 738. According to the embodiment structure of the sensing device 700 of the disclosure the sixth channel 752 mentioned here can include one or more through holes.

In other words, in the sixth embodiment, the first chamber 732 is formed through the second substrate 720, the sealed second chamber 734 is formed through the fourth substrate 770, and the sealed third chamber 736 is formed through the second cover plate 750, and the second cover plate 750 has a sixth channel 752 used to connect the fourth chamber 738 to the outside. Accordingly, the sixth embodiment can provide a first chamber 732, a second chamber 734, a third chamber 736 and a fourth chamber 738 with four different environmental conditions to accommodate different types of first sensing element 142, second sensing element 742, third sensing element 746 and fourth sensing element 748. The environmental condition within the first chamber 732 can be determined by the process environment when the second substrate 720 is attached to the first substrate 710. The environmental condition within the second chamber 734 can be determined by the process environment when the fourth substrate 770 is attached to the second substrate 720. The environmental condition within the third chamber 736 is the environmental condition when the second cover plate 750 is attached to the fourth substrate 770. And the environmental condition within the fourth chamber 738 is the outside environmental condition where the sensing device 750 located.

In the sixth embodiment, the first sensing element 742, the second sensing element 744, the third sensing element 746 and the fourth sensing element 748 are, for example, the sensing elements fabricated by micro-electromechanical process. According to the design in ordinary view of the related art, the sensing element can be classified into two sorts of structures, movable element and fixed element, and the movable element is commonly disposed on the fixed element. (The movable element and the fixed element are familiar to those skilled in the art and thus not shown in figures, and it is not limited to the scope disclosed in the embodiment. The overall relevant similar sensing element structures are included in the spirit and scope of disclosure.) For example, in the embodiment, the fixed element is disposed on the first substrate 710, so that the movable element disposed on the fixed element can hang or suspend upon the carrying surface 710a of the first substrate 710. The first chamber 732, the second chamber 734 or the third chamber 736 is a sealed chamber. Thus, the chamber pressure of the first chamber 732, the second chamber 732 or the third chamber 736 can be controlled under a specific pressure. And the gas composition of the first chamber 132, the second chamber 734 or the third chamber 736 may be the common atmosphere, a specific single gas or gas mixed with two or more specific compositions. At this moment, the first sensing element 742, the second sensing element 744 or the third sensing element 746 which is adapted to be disposed within the first chamber 732, the second chamber 734 or the third chamber 736, for example, is an accelerometer or a radio frequency switch or other possible element. In addition, the first chamber 732, the second chamber 734 or the third chamber 736 may also be a vacuum environment, i.e., the chamber pressure of the first chamber 132, the second chamber 732 or the third chamber 736 is substantially a vacuum pressure. At this moment, the first sensing element 742, the second sensing element 744 or the third sensing element 746 which is adapted to be disposed within the first chamber 732, the second chamber 734 or the third chamber 736, for example, is a quartz crystal, an oscillator, a reference pressure gauge, a radio frequency switch or gyroscope or other possible element. In addition, the fourth chamber 738 is connected to external environment through the third channel 796, the fifth channel 774 and the sixth channel 752, thus the chamber pressure of the fourth chamber 738 is the environmental pressure. The third sensing element 748 adapted to be disposed within the fourth chamber 738, for example, is a pressure gauge, a hydrometer, a gas sensor, an image sensor or a photo sensor or other possible element.

In the sixth embodiment, the second substrate 720 can be formed by stacking the third substrate and the first cover plate, as shown in the structure of FIG. 1B of the second embodiment.

It is similar to the above mentioned fourth embodiment. In the sixth embodiment, chip bonding technique can be used for attaching the second substrate 720 to the first substrate 710, attaching the fourth substrate 770 to the second substrate 720 and attaching the second cover plate 750 to the fourth substrate 770. The chip bonding technique includes direct bonding technique such as cathode bonding, diffusion bonding, or plasma enhanced bonding or the like, or indirect bonding technique using intermediate bonding layer such as conductor, nonconductor or organic polymer or the like. In addition, the forming of the first chamber 732, the second chamber 734, the third chamber 736 and the fourth chamber 738 of the sixth embodiment and the locations of the corresponding concaved portions 722, 724, 726 and 728 can have variations as described in FIG. 5 of the embodiment, and it is not repeated thereto.

The material of the second substrate 720, the fourth substrate 770 and the second cover plate 750 of the sixth embodiment is semiconductor material, for example. For example, the first substrate 710, the second substrate 720, the fourth substrate 770 and the second cover plate 750 are four independent chips respectively. Thus, it is needed to stack the second substrate 720, the fourth substrate 770 and the second cover plate 750 to the first substrate 710, then the corresponding first chamber 732, second chamber 734 and third chamber 736 can be sealed. The sixth embodiment can let the fourth substrate 770 cover the first channel 792 to seal the second chamber 734, no extra material is to fill the first channel 792. Similarly, the second cover plate 750 covers the second channel 794 and the fourth channel 772 to seal the third chamber 736, and no extra filling material or solder is to fill the second channel 794 and the fourth channel 772. That is, the fourth channel 772 and the second channel 794 are filled with no material, and thus the normal operation of the second sensing element 744 and the third sensing element 746 being affected by the relevant elements within the second chamber 734 and the third chamber 736 or the internal wall of the through hole polluted due to the filling material can be avoided.

In addition, since the structure of the fourth substrate 770 used for sealing the second channel 734 and the second cover plate 750 used for sealing the third chamber 736 in the sixth embodiment is much solider than solder or sealing material, comparing to the solder or sealing material with loose structure, a good tightness can be provided. Thus, it facilitates the control of the environmental condition within the second chamber 734 and the third chamber 736.

In the following, the manufacturing method of the sensing device 700 is further described. FIG. 8A to 8G sequentially illustrates the steps of manufacturing the sensing device 700 according to the sixth embodiment of the disclosure. In addition, in order to describe the technical features of sealing the first chamber 732, the second chamber 734 and the third chamber 736 by using the second substrate 720, the fourth substrate 770 and the second cover plate 750, FIG. 9A to 9D respectively illustrates the top view of the structure of FIG. 8A, 8C, 8E and 8G.

Figure 8A:
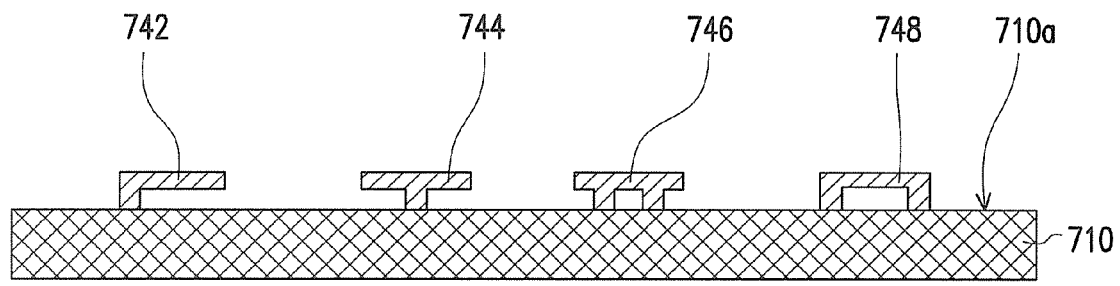
FIG. 8A to 8G sequentially illustrates the steps of manufacturing a sensing device according to the sixth embodiment of the disclosure.
Figure 8B:
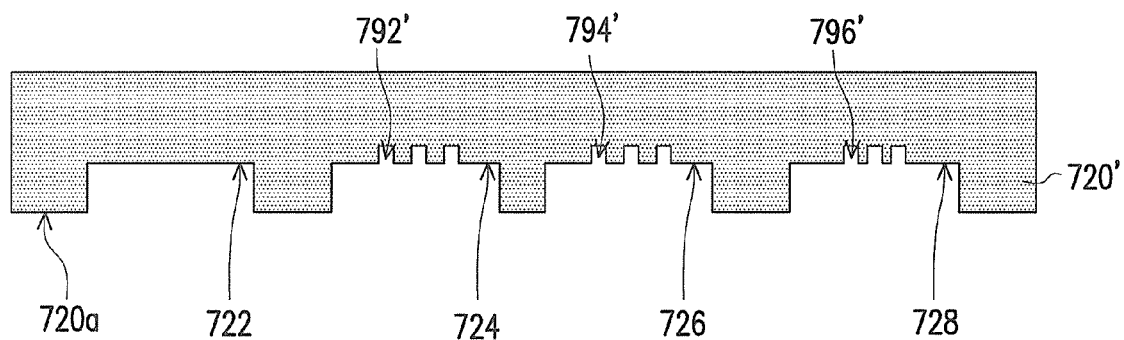
Figure 8C:
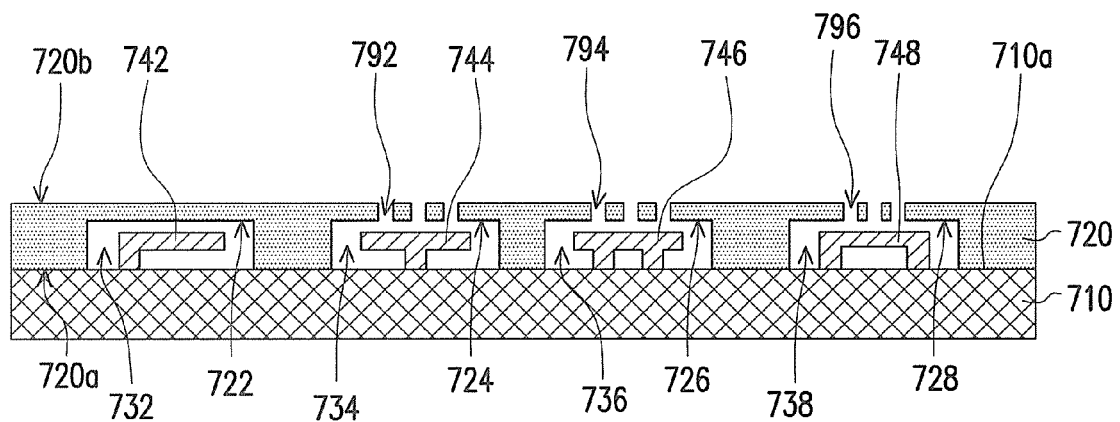
Figure 9A:
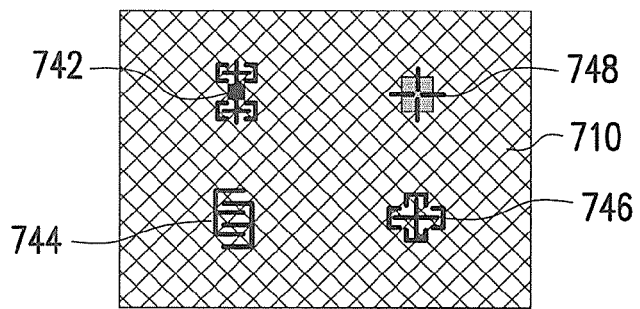
FIG. 9A to 9D respectively illustrates the top view of the structure of FIG. 8A, FIG. 8C, FIG. 8E and FIG. 8G.
Figure 9B:
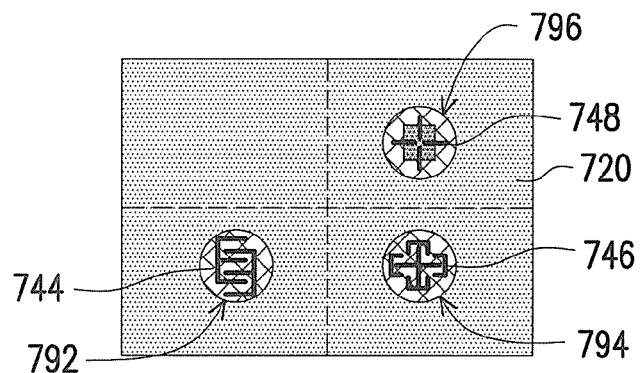
Figure 9C:
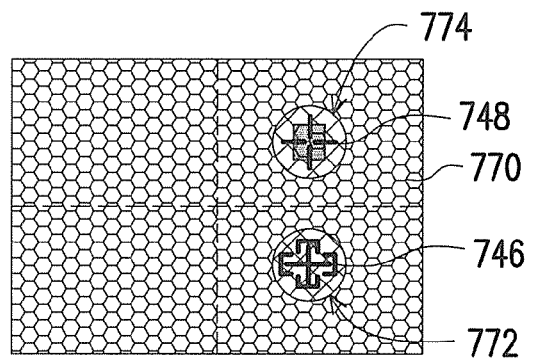
Figure 9D:
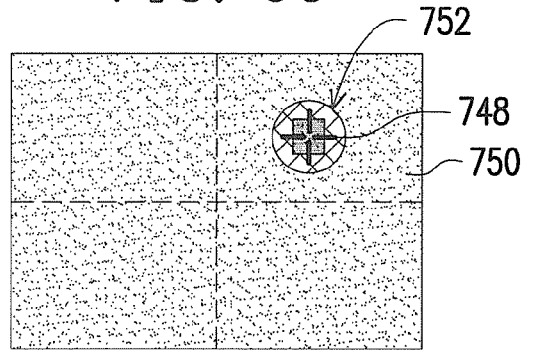

First, as shown in FIG. 8A and FIG. 9A, the first substrate 710 is provided, and the first sensing element 742, the second sensing element 744, the third sensing element 746 and the fourth sensing element 748 are fabricated on the carrying surface 710a of the first substrate 710. Then, the second substrate 720' is provided as shown in FIG. 8B, and the concaved portions 722, 724, 726 and 728, the first channel pre-keep hole 792', the second channel pre-keep hole 794' and the third channel pre-keep hole 796' are fabricated on the first surface 720a of the second substrate 720' by etching process, for example. And then, as shown in FIG. 8C and FIG. 9B, the second substrate 720' is attached to the carrying surface 710a of the first substrate 710 so as to form the first chamber 732, the second chamber 734, the third chamber 736 and the fourth chamber 738 between the second substrate 720' and the first substrate 710. In the step illustrated in FIG. 9C, the second substrate 720' is aimed by constructing the thinning process to the back surface of the second substrate 720', and the first channel 792, the second channel 794 and the third channel 796 are open. The first channel 792, the second channel 794 and the third channel 796 are respectively connected to the second chamber 734, the third chamber 736 and the fourth chamber 738, and the first chamber 732 is sealed between the first substrate 710 and the second substrate 720. At this moment, the environmental condition within the first chamber 732 is equivalent with the process condition when the second substrate 720' is attached to the first substrate 710. Moreover, as shown in the top view of FIG. 9B, the first channel 792, the second channel 794 and the third channel 796 respectively expose the second sensing element 744 within the second chamber 144, the third sensing element 746 within the third chamber 736 and the fourth sensing element 748 within the fourth chamber 738.

Figure 8D:
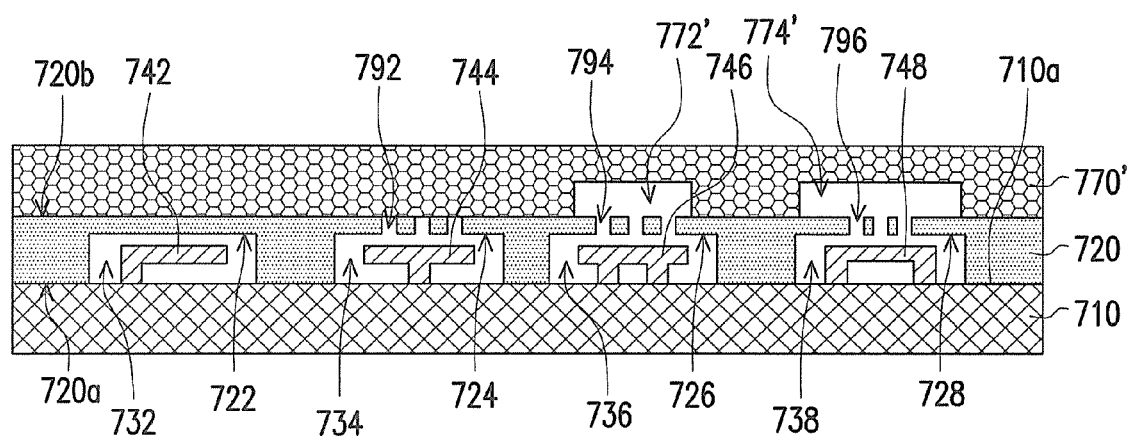
Figure 8E:
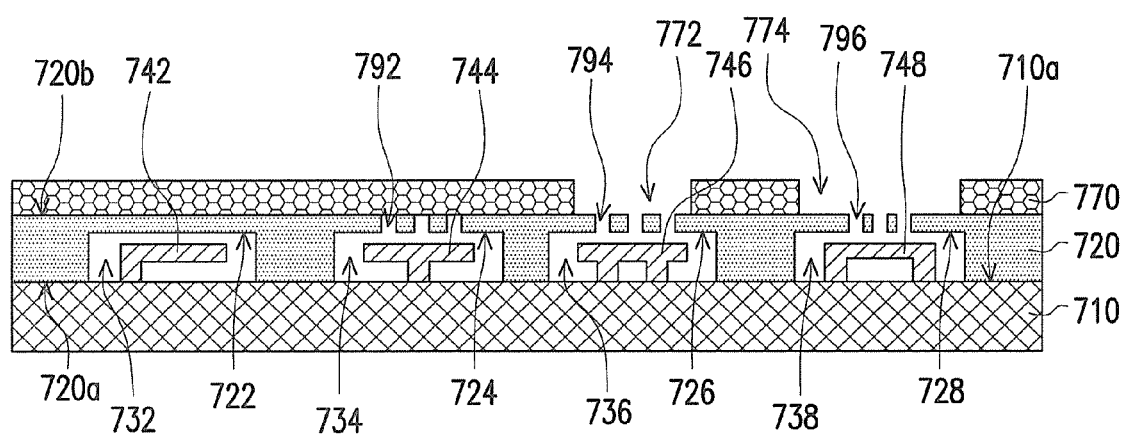

Then, as shown in FIG. 8D, the fourth cover plate 770' is attached to the second surface 120b of the second substrate 720. The fourth channel pre-keep hole 772' and the fifth channel pre-keep hole 774' have been formed earlier on a side of the fourth cover plate 770', and the side having the fourth channel pre-keep hole 772' the fifth channel pre-keep hole 774' is attached to the second surface 720b of the second substrate 720. And then, as shown in FIG. 8E, the above mentioned thinning process is done to the back surface of the fourth substrate 770' so as to form the fourth substrate 770 and expose the fourth channel 772 and the fifth channel 774. At this moment, as shown in the top view of FIG. 9C, the first channel 792 of the second substrate 720 is covered by the fourth cover plate 770 so that the second sensing element 744 is sealed within the second chamber 734. At this moment, the environmental condition within the second chamber 734 is equivalent with the process condition when the fourth substrate 770' is attached to the second substrate 720. Furthermore, since the first chamber 732 has been sealed earlier, the internal environmental condition is not affected by this process condition. In addition, the second channel 794 and the third channel 796 can are respectively connected to the fourth channel 772 and the fifth channel 774 of the fourth substrate 770, so that the fourth substrate 770 exposes the sensing element 746 within the third chamber 736 and the sensing element 748 within the fourth chamber 738.

Figure 8F:
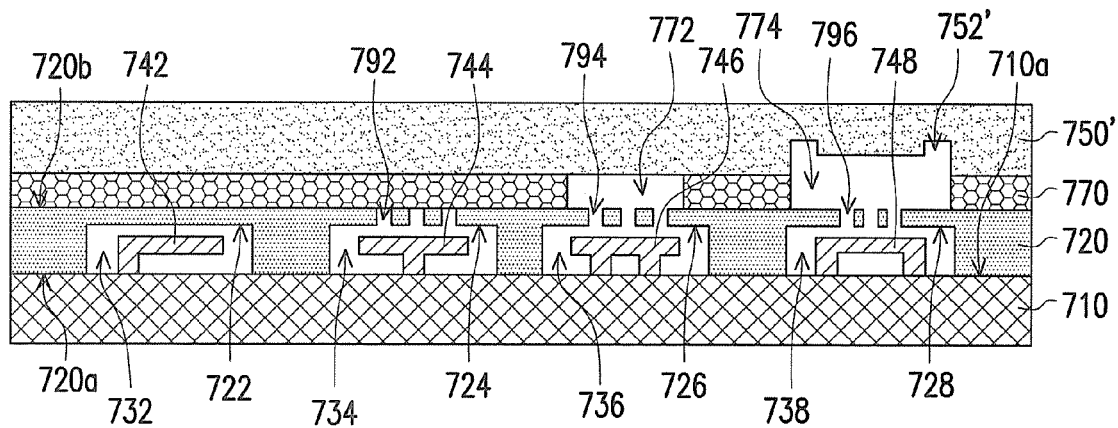
Figure 8G:
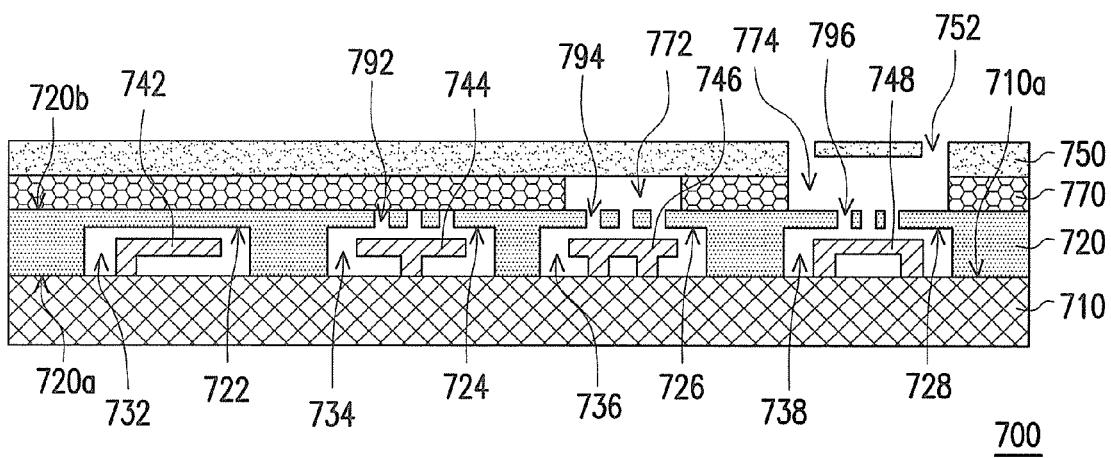

Then, as shown in FIG. 8F, the second cover plate 750' is attached to the fourth substrate 770. The sixth channel pre-keep hole 752' has been formed earlier on a side of the second cover plate 750', and the side having the sixth channel pre-keep hole 752' is attached to the fourth substrate 770. And then, as shown in FIG. 8G, the above mentioned thinning process is done to the back surface of the second cover plate 750' so as to form the second cover plate 750 and expose the sixth channel 752. At this moment, as shown in the top view of FIG. 9D, the fourth channel 772 of the fourth substrate 770 is covered by the second cover plate 750 so that the third sensing element 746 is sealed within the third chamber 736.

At this moment, the environmental condition within the third chamber 736 is equivalent with the process condition when the second cover plate 750' is attached to the fourth substrate 770. Furthermore, since the first chamber 732 and the second chamber 734 have been sealed earlier, the internal environmental condition is not affected by this process condition. In addition, the fifth channel 774 and the sixth channel 752 of the second cover plate 750 are connected so that the second cover plate 750 exposes the sensing element 748 within the fourth chamber 738.

At this point, the fabrication of the sensing device 700 is completed.

According to the foregoing embodiment, it can be seen that the fourth substrate can be inserted between the second cover plate and the formed chamber to obtain extra chambers having different environmental conditions in the disclosure. The number of the chambers and the fourth substrate is not limited in the disclosure, and the number of substrates for stacking can be determined as required. And along with the adjusting the process environment when the substrate are stacked, the environmental conditions within the chambers can be determined.

On the other hand, since substrates are used for sealing the channel of the chamber in the disclosure, comparing to the solder or sealing materials with loose structure, a good tightness is provided and it facilitates the control of the environmental condition within the chamber.

According to the above mentioned capability for providing a good tightness and control of environmental condition within the chamber, the method of forming sealed chamber by using the stacking of multi-substrates can also be applied to a single chamber structure.

Figure 10:
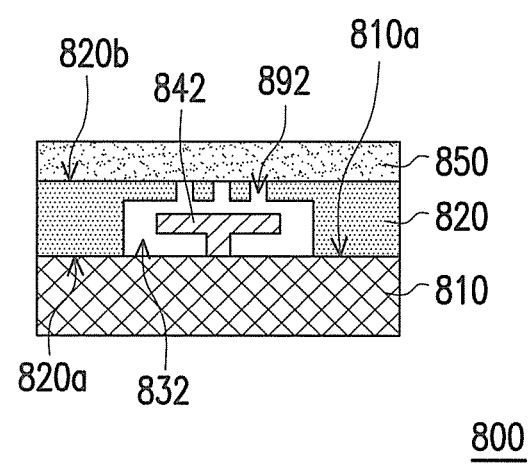
FIG. 10 illustrates a sensing device according to the seventh embodiment of the disclosure.

FIG. 10 illustrates a sensing device 800 according to the seventh embodiment of the disclosure. The relevant techniques with similarities or equivalents have been described in foregoing embodiments, and it is not repeated in this embodiment.

As shown in FIG. 10, the sensing device 800 of the seventh embodiment includes a first substrate 810, a second substrate 820 and a second cover plate 850. The first substrate 810 has a carrying surface 810a. The second substrate 820 has a first surface 820a and a second surface 820b opposite to the first surface 820a. In addition, the second substrate 820 is attached to the carrying surface 810a of the first substrate 810, and there is a chamber 832 between the second substrate 820 and the first substrate 810. The sensing element 842 is disposed within the chamber 832. The second substrate 820 has a channel 892 connecting the chamber 832 to the second surface 820b. In addition, the second cover plate 850 is attached to the second surface 820b of the second substrate 820. The second cover plate 850 covers the channel 892 to seal the chamber 832, and the channel is not filled with any other material to seal the channel 892. In other words, the channel 892 of the seventh embodiment is sealed through the attaching force between the second cover plate 850 and the second substrate 820.

As shown in the embodiments, the environmental condition within the chamber 832 can be one of (1) specific pressure of atmosphere, (2) specific pressure of specific gas composition and (3) vacuum pressure. Under the environmental condition (1) or (2), the sensing element 842 can be an accelerometer or a radio frequency switch or other possible element. In addition, under the environmental condition (3), the sensing element 842 can be a quartz crystal, an oscillator, a reference pressure gauge, a radio frequency switch or a gyroscope or other possible element.

In the manufacturing method of the seventh embodiment, for example, the chamber 832 and the sensing element 842 within the chamber 832 are firstly formed on the carrying surface 810a of the first substrate 810 through the second substrate 820. In addition, the sensing element 842 can be released through the channel 892 of the second substrate 820 to be the movable element. Then, the channel 892 and the channel 832 have to be sealed after releasing the sensing element 842. Thus, the second cover plate 850 is attached to the second substrate 820 to cover the channel 892 and seal the chamber 832. The environmental condition within the chamber 832 is the same as above mentioned, determined when the second cover plate 850 is attached to the second substrate 820.

Figure 11:
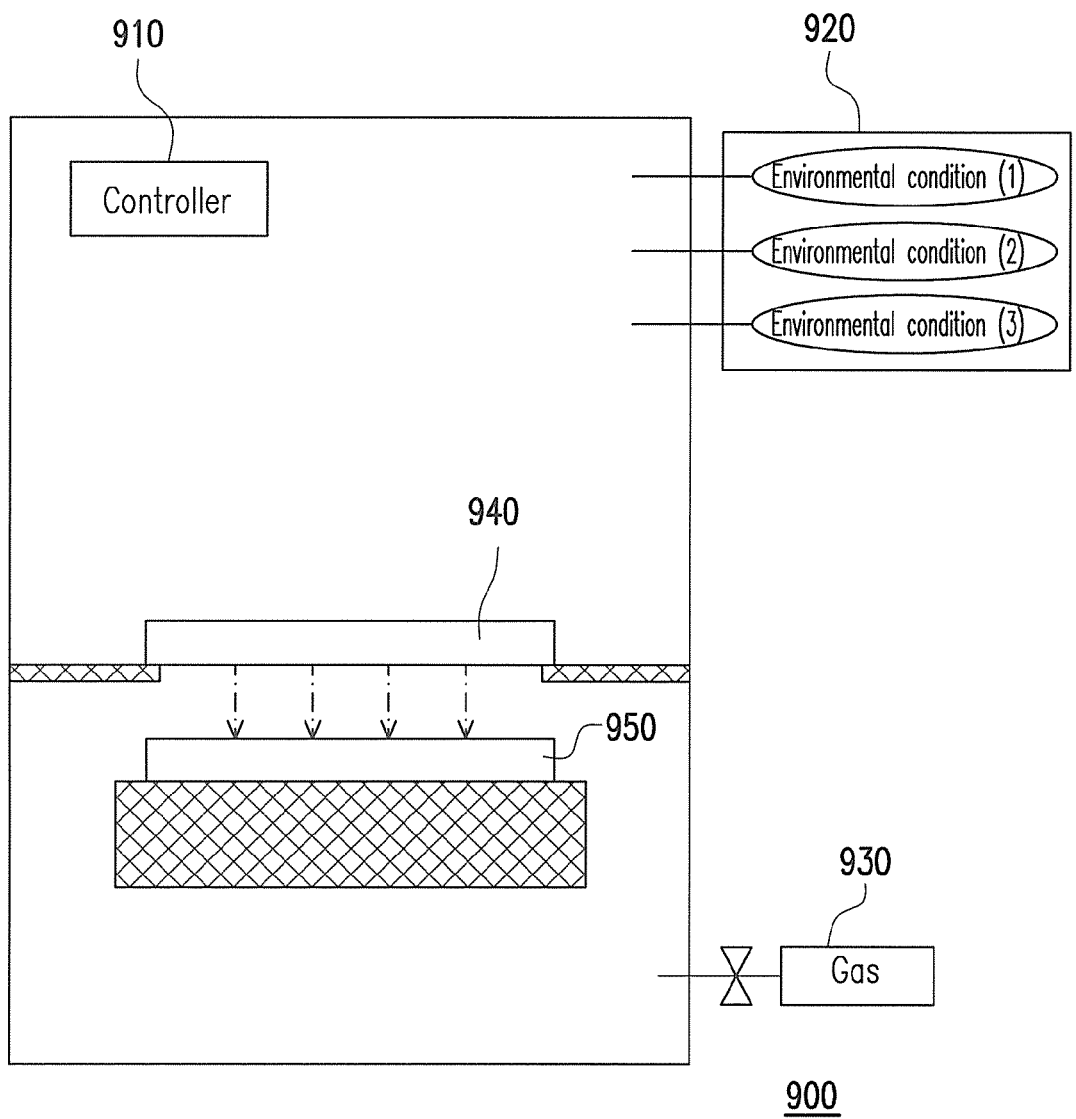
FIG. 11 illustrates a manufacturing machine according to each embodiment of the disclosure.

FIG. 11 illustrates a manufacturing machine according to each embodiment of the disclosure. In order to form the chambers with different environmental conditions, a controller 910 is disposed within the machine 900 of the embodiment. It controls the environmental condition selecting device 920 and the gas inlet device 930 according to the environmental conditions of the required process of attaching the first substrate 940 and the second substrate 950, so as to adjust the pressure and gas composition within the machine 900. The first substrate 940 and the second substrate 950 described herein can be the correspondingly attaching two among the foregoing of the first substrate, the second substrate, the fourth substrate and the second cover plate. As shown in FIG. 11, the environmental condition selecting device 920 can select the environmental condition as described above, may include: (1) specific pressure of atmosphere, (2) specific pressure of specific gas composition and (3) vacuum pressure. And the gas inlet device 930 can inlet the common atmosphere, a specific single gas or gas mixed with two or more specific compositions and control the pressure within the machine 900. By using the machine 900, when the sensing elements are correspondingly attached and stacked to substrates to form sealed chambers in the embodiments, the required environmental conditions (like pressure and gas compositions etc.) of the sealed chamber can be selected to meet the requirements of different sensing elements.

In light of foregoing, multi-chambers with different environmental conditions can be integrated on the same first substrate (for example, chip) in the disclosure, so as to accommodate different types of sensing element, wherein the environmental condition within the chamber can be determined by the process environment when attaching the substrates. The different chamber environmental conditions provided in the disclosure includes different chamber pressure, (such as vacuum, low pressure, atmosphere etc.), different chamber gas compositions (such as the common atmosphere, a specific single gas or gas mixed with two or more specific compositions) and different chamber structures (such as closed-type chamber, open-type chamber) etc. Furthermore, the sensing element provided in the disclosure is simple in structure, easy to fabricate, no extra filling process and it facilitates to improve process yield and reduce manufacturing cost. Moreover, in the disclosure, the channels of chamber are sealed by using substrate. Thus, comparing to the solder or sealing materials with loose structure, a good tightness is provided and it facilitates the control of the environmental condition within the chamber.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A sensing device, comprising:
a first substrate, having a carrying surface;
a second substrate, having a first surface and a second surface opposing to the first surface, the second substrate being attached to the carrying surface of the first substrate through the first surface, and a plurality of chambers being included between the second substrate and the first substrate, the second substrate sealing a first chamber of the plurality of chambers, and the second substrate having at least one channel connecting one of the remaining chambers to the second surface; and
a plurality of sensing elements, respectively disposed within the chambers, wherein the first substrate has a plurality of concaved portions on the carrying surface, the chambers are formed between the concaved portions and the first surface, and the sensing elements are disposed on the carrying surface.

2. The sensing device as claimed in claim 1, wherein the first chamber comprises an environmental condition of atmospheric air under specific pressure, or gas in specific pressure and specific composition, or vacuum pressure.

3. The sensing device as claimed in claim 1, wherein the sensing element within the first chamber comprises an accelerometer, a radio frequency switch, a quartz crystal, an oscillator, a reference pressure gauge or a gyroscope.

4. The sensing device as claimed in claim 1, further comprising a first cover plate disposed on the second surface of the second substrate, the at least one channel comprising a first channel connecting a second chamber of the plurality of chambers, the first cover plate covering the first channel to seal the second chamber.

5. The sensing device as claimed in claim 4, wherein an environmental condition within the first chamber is different from an environmental condition within the second chamber, and the first chamber or the second chamber comprises an environmental condition of atmospheric air under specific pressure, or gas in specific pressure and specific composition, or vacuum pressure.

6. The sensing device as claimed in claim 5, wherein the sensing element within the first chamber or the second chamber comprises an accelerometer, a radio frequency switch, a quartz crystal, an oscillator, a reference pressure gauge or a gyroscope.

7. The sensing device as claimed in claim 1, further comprising a first cover plate, disposed on the second surface of the second substrate, the at least one channel comprising a first channel connected to the second chamber of the plurality of chambers and a second channel connected to a third chamber of the plurality of chambers, the first cover plate covering the first channel to seal the second chamber, and the first cover plate having a third channel passing through the first cover plate and being connected to the second channel and the third chamber.

8. The sensing device as claimed in claim 7, wherein an environmental condition within the first chamber is different from an environmental condition within the second chamber, and the first chamber or the second chamber comprises an environmental condition of atmospheric air under specific pressure, or gas in specific pressure and specific composition, or vacuum pressure.

9. The sensing device as claimed in claim 8, wherein the sensing element within the first chamber or the second chamber comprises an accelerometer, a radio frequency switch, a quartz crystal, an oscillator, a reference pressure gauge or a gyroscope.

10. The sensing device as claimed in claim 7, wherein an environment condition within the third chamber is the same as a condition of external environment.

11. The sensing device as claimed in claim 10, wherein the sensing element within the third chamber comprises a pressure gauge, a hygrometer, a gas sensor, an image sensor or a photo sensor.

12. The sensing device as claimed in claim 1, wherein the second substrate comprising a third substrate and a first cover plate, the first cover plate being stacked on the third substrate.

13. A sensing device, comprising:
a first substrate, having a carrying surface;
a second substrate, having a first surface and a second surface opposing to the first surface, the second substrate being attached to the carrying surface of the first substrate through the first surface, and a plurality of chambers being included between the second substrate and the first substrate, the second substrate sealing a first chamber of the plurality of chambers, and the second substrate having at least one channel connecting at least one of the remaining chambers to the second surface;
a plurality of sensing elements, respectively disposed within the chambers;
a third substrate, disposed on the second surface of the second substrate, the at least one channel comprising a first channel, a second channel and a third channel, the first channel, the second channel and the third channel being respectively connected to a second chamber, a third chamber and a fourth chamber of the plurality of chambers, the third substrate covering the first channel to seal the second chamber, the third substrate having a fourth channel and a fifth channel both passing through the third substrate, the fourth channel being connected to the second channel and the third chamber, and the fifth channel being connected the third channel and the fourth chamber; and
a first cover plate, disposed on the third substrate, the first cover plate covering the fourth channel of the third substrate to seal the third chamber, and the first cover plate having a sixth channel passing through the first cover plate and being connected to the fifth channel and the fourth chamber.

14. The sensing device as claimed in claim 13, wherein an environmental condition within the first chamber, an environmental condition within the second chamber and an environmental condition within the third chamber are different from one another, and the first chamber, the second chamber or the third chamber comprises an environmental condition of atmospheric air under specific pressure, or gas in specific pressure and specific composition, or vacuum pressure.

15. The sensing device as claimed in claim 14, wherein the sensing element within the first chamber, the second chamber or the third chamber comprises an accelerometer, a radio frequency switch, a quartz crystal, an oscillator, a reference pressure gauge or a gyroscope.

16. The sensing device as claimed in claim 13, wherein an environment condition within the fourth chamber is the same as a condition of external environment.

17. The sensing device as claimed in claim 16, wherein the sensing element within the fourth chamber comprises a pressure gauge, a hygrometer, a gas sensor, an image sensor or a photo sensor.

18. A sensing device, comprising:
a first substrate, having a carrying surface;

a second substrate, having a first surface and a second surface opposing to the first surface, the second substrate being attached to the carrying surface of the first substrate through the first surface, and at least one chamber being included between the second substrate and the first substrate, and the second substrate having a channel connecting the chamber to the second surface; and a first cover plate, attached to the second surface of the second substrate, the first cover plate covering the channel to seal the chamber; and a micro-electromechanical sensing element, disposed within the chamber, wherein the first substrate has a concaved portion on the carrying surface, the chamber is formed between the concaved portion and the first surface, and the micro-electromechanical sensing element is disposed on the carrying surface.

19. The sensing device as claimed in claim 18, wherein the chamber comprises an environmental condition of atmospheric air under specific pressure, or gas in specific pressure and specific composition, or vacuum pressure.

* * * * *